(12) United States Patent
Sunohara et al.

(10) Patent No.: US 7,122,901 B2
(45) Date of Patent: Oct. 17, 2006

(54) SEMICONDUCTOR DEVICE

(75) Inventors: Masahiro Sunohara, Nagano (JP); Keisuke Ueda, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 11/108,711

(22) Filed: Apr. 19, 2005

(65) Prior Publication Data

US 2005/0230835 A1   Oct. 20, 2005

(30) Foreign Application Priority Data

Apr. 20, 2004   (JP)   ............... 2004-123998

(51) Int. Cl.
*H01L 23/48*   (2006.01)
*H01L 23/52*   (2006.01)
*H01L 29/40*   (2006.01)

(52) U.S. Cl. ............... 257/758; 257/750; 257/774; 257/773; 257/775; 257/776; 257/761; 257/762

(58) Field of Classification Search ............... 257/758, 257/774, 750
See application file for complete search history.

(56) References Cited

U.S. PATENT DOCUMENTS

| | | | | |
|---|---|---|---|---|
| 5,291,066 A | * | 3/1994 | Neugebauer et al. | 257/750 |
| 5,338,975 A | * | 8/1994 | Cole et al. | 257/750 |
| 5,422,513 A | * | 6/1995 | Marcinkiewicz et al. | 257/668 |
| 5,757,072 A | * | 5/1998 | Gorowitz et al. | 257/700 |
| 5,874,770 A | * | 2/1999 | Saia et al. | 257/536 |
| 5,883,335 A | * | 3/1999 | Mizumoto et al. | 174/266 |
| 6,091,137 A | * | 7/2000 | Fukuda | 257/679 |
| 6,237,218 B1 | * | 5/2001 | Ogawa et al. | 29/830 |
| 6,630,743 B1 | * | 10/2003 | Magnuson et al. | 257/774 |
| 6,707,124 B1 | * | 3/2004 | Wachtler et al. | 257/433 |
| 6,770,971 B1 | * | 8/2004 | Kouno et al. | 257/734 |
| 6,803,649 B1 | * | 10/2004 | He et al. | 257/691 |
| 6,856,023 B1 | * | 2/2005 | Muta et al. | 257/774 |
| 2001/0004130 A1 | | 6/2001 | Higashi et al. | |
| 2001/0029065 A1 | * | 10/2001 | Fischer et al. | 438/115 |
| 2006/0032668 A1 | * | 2/2006 | Wakihara et al. | 174/260 |

FOREIGN PATENT DOCUMENTS

JP   2001-177045   6/2001

\* cited by examiner

*Primary Examiner*—Jasmine Clark
(74) *Attorney, Agent, or Firm*—Armstrong, Kratz, Quintos, Hanson & Brooks, LLP

(57) ABSTRACT

In a semiconductor device, a plurality of wiring layers each patterned in a required shape are laminated over both surfaces of an insulating base material with insulating layers interposed therebetween, and electrically connected to one another through via holes piercing the insulating layers in the direction of thickness. A chip is mounted in an embedded manner in one insulating layer over at least one surface of the insulating base material. Electrodes of the chip are connected to one wiring layer. Through holes are formed in portions of the insulating base material, the portions corresponding to a mount area for the chip. Via holes are formed on outwardly extending portions (pad portions) of the wiring layer connected to a conductor layer formed at least on the inner walls of the through holes.

7 Claims, 11 Drawing Sheets

FIG. 2A  PRESENT INVENTION
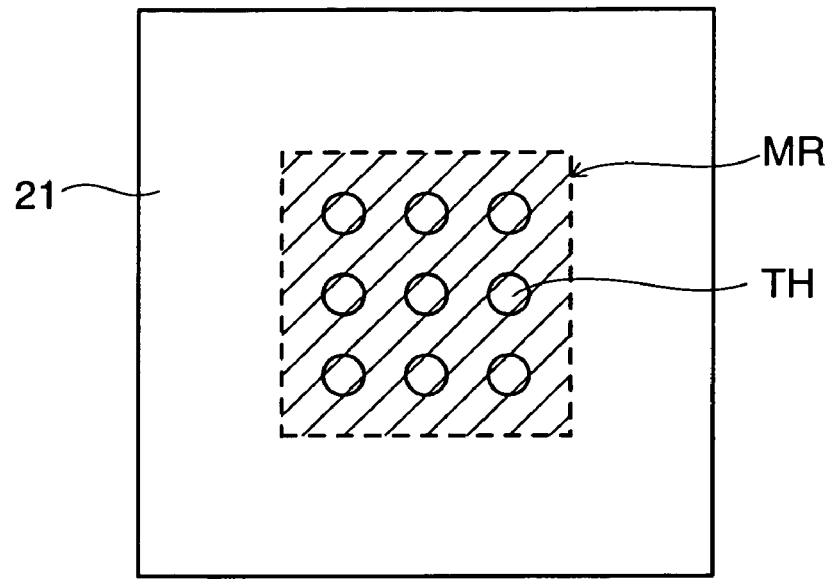
FIG. 2B  PRIOR ART
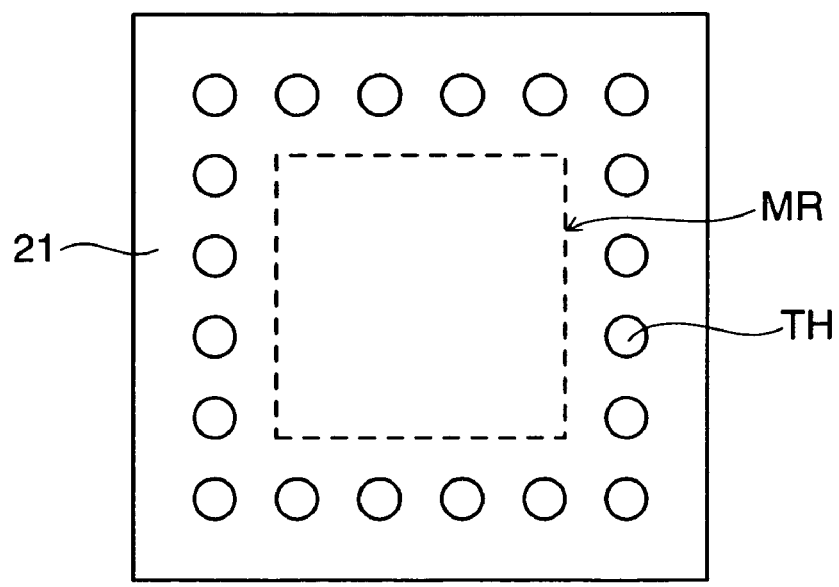

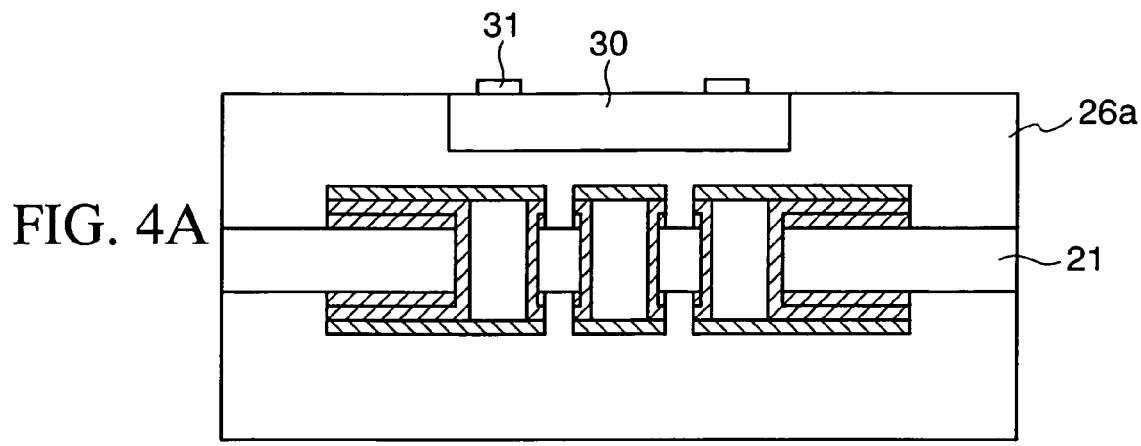
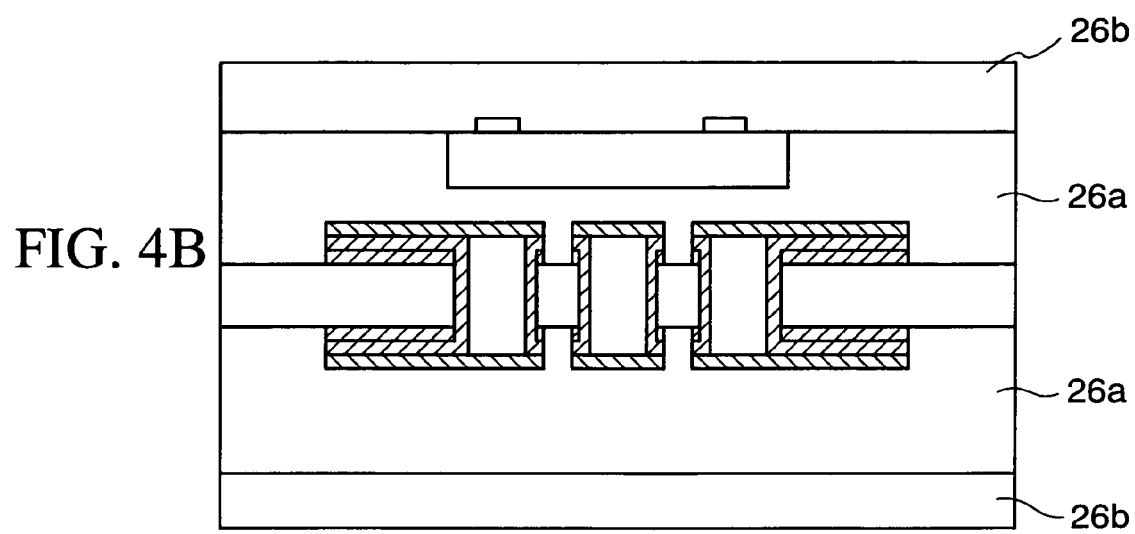
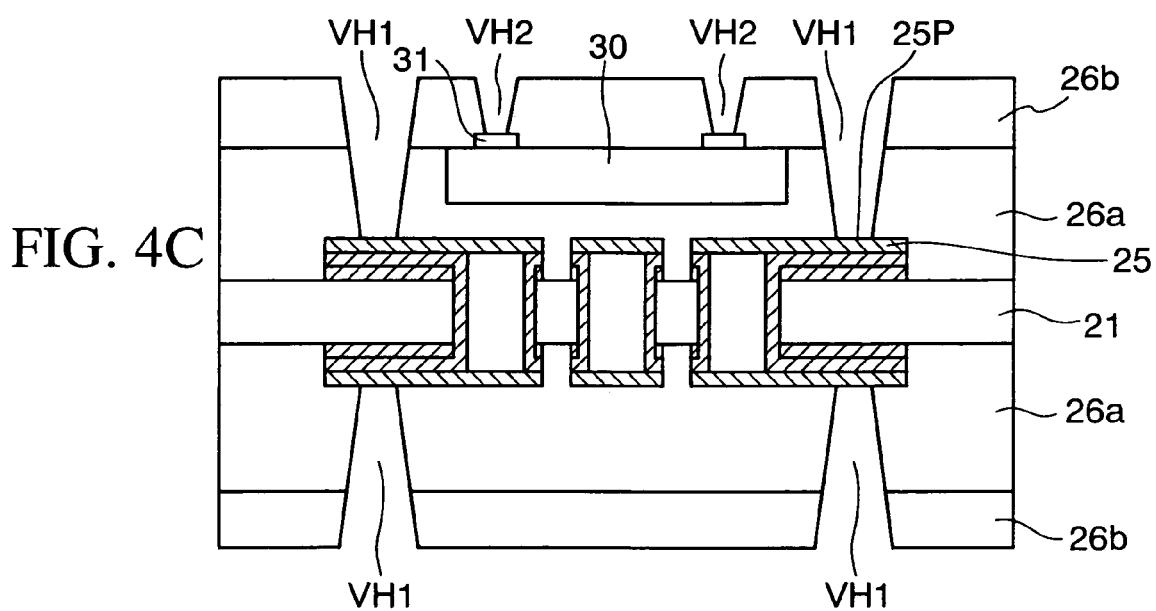

STEPS OF FIGS. 3A-3E

SEMICONDUCTOR DEVICE

CROSS-REFERENCE TO RELATED APPLICATIONS

This application is based on and claims priority of Japanese Patent Application No. 2004-123998 filed on Apr. 20, 2004, the entire contents of which are incorporated herein by reference.

BACKGROUND OF THE INVENTION (a) Field of the Invention

The present invention relates to a semiconductor device. In particular, the present invention relates to a semiconductor device having a package structure in which a chip, such as a semiconductor element or electronic component, is mounted within a wiring board. In the following description, for convenience, a semiconductor device in which a chip is mounted within a wiring board is also referred to as a "chip-embedded package."

(b) Description of the Related Art

In recent years, for printed wiring boards, weight reduction is required, and finer and denser wiring is required in order to mount a ball grid array (BGA), a pin grid array (PGA), a chip-sized package (CSP), or the like, which have been miniaturized and come to have a large number of pins. However, since conventional printed wiring boards have needed large areas for the formation of via holes, flexibility in design has been limited, and thus finer wiring has been difficult to realize. In view of this background, the commercialization of printed wiring boards (build-up multilayer wiring boards) using a build-up process has been recently advanced. As for the build-up multilayer wiring boards, various types can be fabricated depending on a combination of the material for an interlayer insulating layer and the via hole formation process. In a basic process thereof, conductor layers are stacked by sequentially repeating the formation of an insulating layer, the formation of via holes for interlayer connection in the insulating layer, and the formation of a conductor layer (patterned interconnections, pads, and the like) including the insides of the via holes. In a multilayer wiring board obtained using such a build-up process, even a semiconductor element (chip) having an advanced integration degree and the like can be mounted thereon.

On the other hand, as a technique of increasing the integration degree and versatility of a semiconductor device, a package structure has been proposed which is intended to form a required circuit block by incorporating a semiconductor element (chip) in a board or stacking semiconductor elements (chips) in a board. In this package structure, since the chip (or chips) is embedded in the board, via holes for vertical interlayer connection cannot be formed in a region corresponding to a mount area for the chip. Accordingly, via holes for interlayer connection are formed in a region around the region corresponding to the mount area for the chip.

Further, in an existing build-up multilayer wiring board into which a chip is incorporated, via holes for interlayer connection are formed on through holes formed in a core substrate. Namely, as in the case of the via holes, the through holes are also formed in a region around the region corresponding to the mount area for the embedded chip. FIG. 11 shows one example thereof. In this drawing, reference numeral 1 denotes an insulating core substrate; reference numeral 2 denotes a plated layer of metal (e.g. copper (Cu)) which is formed on the inner wall and an end portion of a through hole TH formed in the core substrate 1; reference numeral 3 denotes resin (e.g. epoxy resin) as an insulator filled inside the plated layer 2 in the through hole TH; reference numeral 4 denotes a conductor (e.g. Cu) layer thickly formed (approximately 50 µm) on the through hole TH; reference numeral 5 denotes a build-up resin as an interlayer insulating layer; and reference numeral 6 denotes a wiring layer formed by filling the inside of a via hole VH formed on the conductor layer 4 on the through hole TH. The wiring layer 6 is formed in a required pattern shape and connected to electrodes of an embedded chip (approximately 50 µm in thickness). The purpose of thickly forming the conductor layer 4 is to match the height of the surface thereof to that of the mounted chip.

Technologies relating to the above-described conventional technology include, for example, as described in Japanese unexamined Patent Publication (JPP) 2001-177045, a semiconductor device in which a wiring pattern is formed on a core substrate with an insulating layer interposed therebetween, and in which a semiconductor element having a thickness smaller than that of the insulating layer is electrically connected to the wiring pattern by flip-chip bonding and is mounted in an internal portion where the wiring pattern is formed.

In the conventional chip-embedded package, as described above, as illustrated in FIG. 11, the through hole TH of the core substrate is formed in a region around the embedded chip. Further, the via hole VH is formed on the through hole TH (filled resin 3) with the thickly-formed conductor layer 4 interposed therebetween. In this case, the conductor (part of the wiring layer 6) to be filled in the via hole VH is not formed in the same step, as the conductor layer 4 is, to be integrated therewith, but is formed on the conductor layer 4 after the formation of the conductor layer 4, the deposition of the build-up resin 5, and the formation of the via hole VH.

Accordingly, where a temperature cycling test (e.g. test in which the following cycle is repeated several times: the environmental temperature for the package is raised to +125° C. and maintained for a certain period of time, then rapidly lowered to −125° C. and maintained for a certain period of time, and then rapidly raised to +125° C. and maintained for a certain period of time) is performed on the above-described structure, there is a possibility in that, due to thermal stress caused by temperature changes, cracks will appear at the connection interface between the conductor layer 4 and the conductor (6) in the via hole VH which is in contact with the conductor layer 4 (see FIG. 11). This is not so serious if a portion in which cracks appear is merely part of the connection interface. However, in the case where cracks spread all over the connection interface (i.e. rupture occurs at the connection interface), there arises a disadvantage in that the electrical connection between the conductor layer 4 and the wiring layer 6 is not secured. This results in a deterioration in the reliability of the semiconductor device as a final product.

Moreover, there has been the following problem: during the temperature cycling test, there occurs a phenomenon (so-called "pumping") in which the resin 3 in the through hole TH expands and contracts by repeating thermal expansion and thermal contraction, and the pumping acts as a trigger and makes the above-described cracks more easy to appear. Further, such pumping can occur not only in the resin 3 in the through hole TH, but also in the build-up resin 5. Accordingly, there has also been the following problem: depending on the degree of the expansion or contraction of resin caused by pumping, the wiring layer 6 formed on the build-up resin undulates, and, in some cases, cracks in wiring are caused.

SUMMARY OF THE INVENTION

An object of the present invention is to provide a semiconductor device which can prevent cracks from occurring even where a temperature cycling test is performed, and which can consequently contribute to an improvement in reliability on a product basis.

To attain the above object, according to the present invention, there is provided a semiconductor device including:

an insulating base material; a plurality of wiring layers each patterned in a required shape and laminated over both surfaces of the insulating base material with at least one insulating layer interposed therebetween, the wiring layers being electrically connected to one another through at least one via hole, the via hole being formed to pierce the insulating layer in a direction of thickness; and a chip mounted in an embedded manner in the insulating layer over at least one surface of the insulating base material, the chip having at least one electrode electrically connected to one of the wiring layers, in which at least one through hole is formed in a portion of the insulating base material, the portion corresponding to a mount area for the chip, and each via hole is formed on an outwardly extending portion of one of the wiring layers, the one wiring layer being electrically connected to a conductor layer formed at least on an inner wall of the through hole.

According to the constitution of the semiconductor device of the present invention, the position of the through hole to be formed in the insulating base material is arranged to be included in the chip mount area. Further, the via hole for interlayer connection is formed on a portion of the wiring layer electrically connected to the conductor layer formed at least on the inner wall of the through hole, the portion extends in an outward direction, i.e. extends toward the outside of the chip mount area. Namely, this is not a structure in which via holes are formed on through holes with a thickly-formed conductor layer interposed therebetween, such as encountered in a conventional technology (FIG. 11), but a structure in which the via hole is formed the position a position deviated from the position on the through hole outwardly.

Accordingly, where a temperature cycling test is performed on the above-described structure, even if pumping occurs due to the expansion and contraction of resin in the through hole as heretofore, the influence thereof is not exerted directly on the via hole. Consequently, cracks such as encountered in conventional technologies can be effectively prevented from occurring. This contributes to an improvement in reliability as a final product.

Further, since the influence of pumping is not exerted directly on the via hole, the influence thereof is not exerted on the wiring layer electrically connected through the via hole. As a result, the relevant wiring layer does not undulate, and cracks in wiring do not occur.

Other structural features of the present invention and advantages obtained thereby will be described with reference to detailed embodiments below.

BRIEF DESCRIPTION OF THE DRAWINGS

FIGS. 2A and 2B are views schematically showing the constitution of the semiconductor device of FIG. 1 as seen two-dimensionally at a core substrate, in comparison with that of prior art;

FIGS. 4A to 4C are cross-sectional views showing manufacturing steps subsequent to the steps of FIGS. 3A to 3E;

DESCRIPTION OF THE PREFERRED EMBODIMENTS

Figure 1:
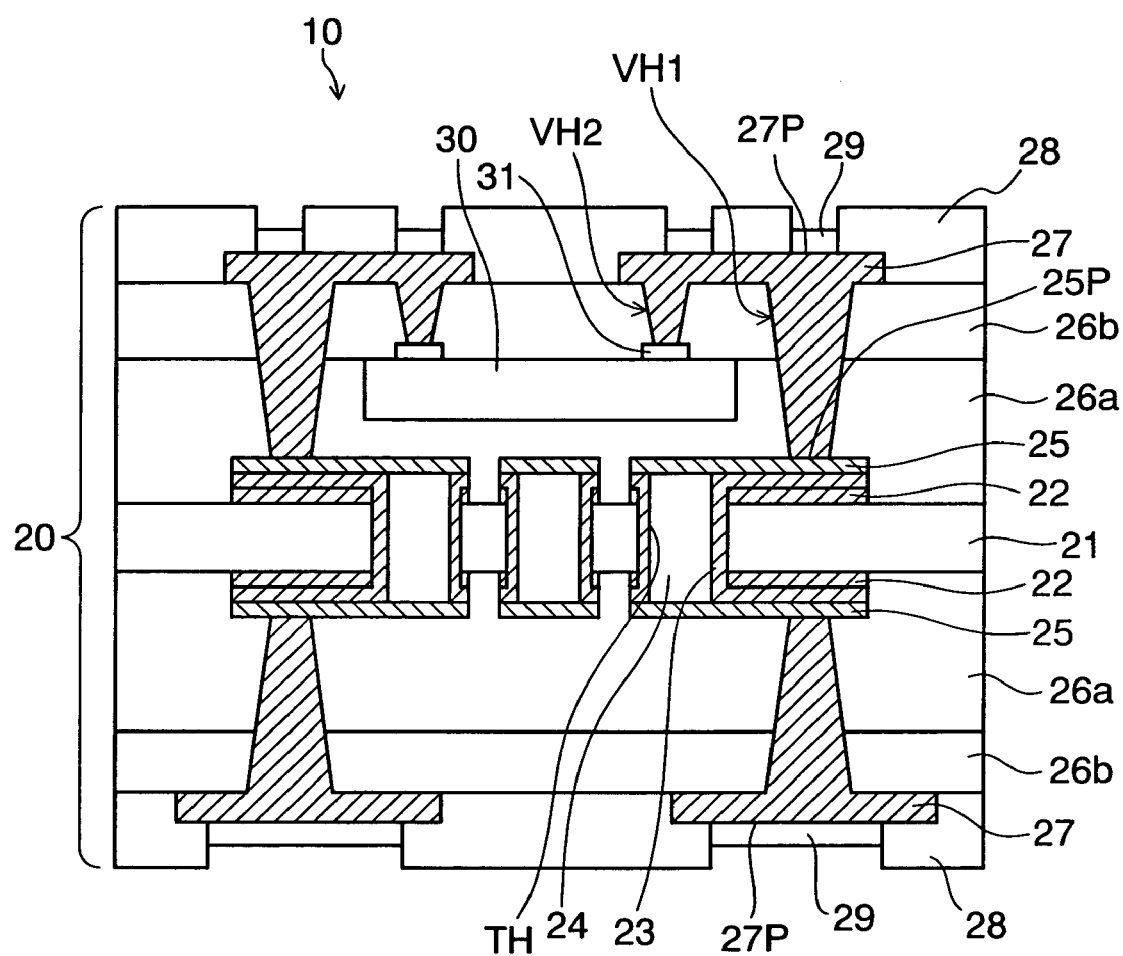
FIG. 1 is a cross-sectional view showing the constitution of a semiconductor device (chip-embedded package) according to a first embodiment of the present invention.

FIG. 1 schematically shows, in a cross-sectional view, the constitution of a semiconductor device according to a first embodiment of the present invention.

The semiconductor device 10 according to this embodiment includes a wiring board 20 used as a package, and a semiconductor element (silicon (Si) chip) 30 mounted in the wiring board (package) 20 in an embedded manner. In the wiring board (package) 20, reference numeral 21 denotes an insulating base material (e.g., a glass cloth immersed in thermosetting resin, such as epoxy resin or polyimide resin) as a core substrate of this package; reference numeral 22 denotes a copper foil attached to each surface of the core substrate 21; reference numeral 23 denotes a plated layer of metal (e.g. copper (Cu)) formed on the copper foil 22 and the inner walls of through holes TH which are formed at specific positions in the core substrate 21 to pierce the core substrate 21 in the thickness direction; reference numeral 24 denotes an insulator (e.g. epoxy resin) filled inside the plated Cu layer 23 in the through hole; reference numeral 25 denotes a wiring layer (e.g. Cu) formed on the plated Cu layer 23 and the insulator 24 and patterned in a required shape on each side of the core substrate 21; reference numerals 26a and 26b denote resin layers (e.g. epoxy resin layers) as interlayer insulating layers, which collectively constitute a two-layer structure and which are formed on the wiring layer 25 and the core substrate 21 on each side of the core substrate 21; and reference numeral 27 denotes a wiring layer (e.g. Cu) formed on each resin layer 26b and patterned in a required shape.

Each of the wiring layers 25 and 27 is patterned into a required shape. In doing so, the wiring layers 25 and 27 are formed to include pad portions 25P and 27P. In the illustrated example, the pad portions 25P of each inner wiring layer 25 are formed and patterned to correspond to the positions of interlayer-connection via holes VH1 formed in the corresponding resin layers 26a and 26b, and the pad portions 27P of each outermost wiring layer 27 are formed and patterned to correspond to the positions of electrodes of an external semiconductor element (chip) to be mounted and the bonding positions of external connection terminals used when the semiconductor device 10 is mounted on a printed wiring board such as a mother board. Further, the wiring layer 27 on the side (upper side in the illustrated example) where an external semiconductor chip is to be mounted is formed and patterned to fill the insides of via holes VH1, which are formed to reach pad portions 25P of the wiring layer 25 in a region around the embedded chip 30, and to fill the insides of via holes VH2, which are formed to reach electrodes 31 of the chip 30 in the mount area for the embedded chip 30. Similarly, the wiring layer 27 on the lower side is formed and patterned to fill the insides of via holes VH1, which are formed to reach pad portions 25P of the wiring layer 25 in a region around the embedded chip 30.

Further, reference numeral 28 denotes solder resist layers as protective films formed to cover the wiring layers 27 and the resin layers 26b in such a manner that the pad portions 27P of the wiring layers 27 on both sides are exposed, and reference numeral 29 denotes plated layers of nickel (Ni) and gold (Au) which are deposited on the pad portions 27P exposed from the solder resist layers 28 on both sides.

On the other hand, the semiconductor chip 30 is mounted in an embedded manner in the resin layer 26a on the side (upper side illustrated in the illustrated example) where an external semiconductor chip is to be mounted. The electrodes 31 of the embedded semiconductor chip 30 are connected to the wiring layer 27 through the via holes VH2 formed in the resin layer 26b. Further, it is desirable that a semiconductor chip having a thickness as small as possible be used as the semiconductor chip 30, because it is mounted in the wiring board (package) 20 in an embedded manner. In the state of the art, semiconductor chips having thicknesses of approximately 50 μm to 100 μm are provided. It is technically possible to embed a semiconductor chip having a thickness in this range in the board. Accordingly, in the present embodiment, a thin semiconductor chip having a thickness of approximately 50 μm is used as the semiconductor chip 30 to be embedded.

FIGS. 2A and 2B schematically show the constitution of the semiconductor device (chip-embedded package) 10 according to this embodiment as seen two-dimensionally at a core substrate 21, in comparison with that of a prior art. In these drawings, the hatched region MR surrounded by a dashed-line indicates a mount area for the semiconductor chip 30 to be embedded. In the prior art (FIG. 2B), through holes TH are placed in a portion of the core substrate 21 which corresponds to an area around the chip mount area MR, while in the present invention (FIG. 2A), the through holes TH are placed in a portion of the core substrate 21 which corresponds to a region in the chip mount area MR.

Figure 11:
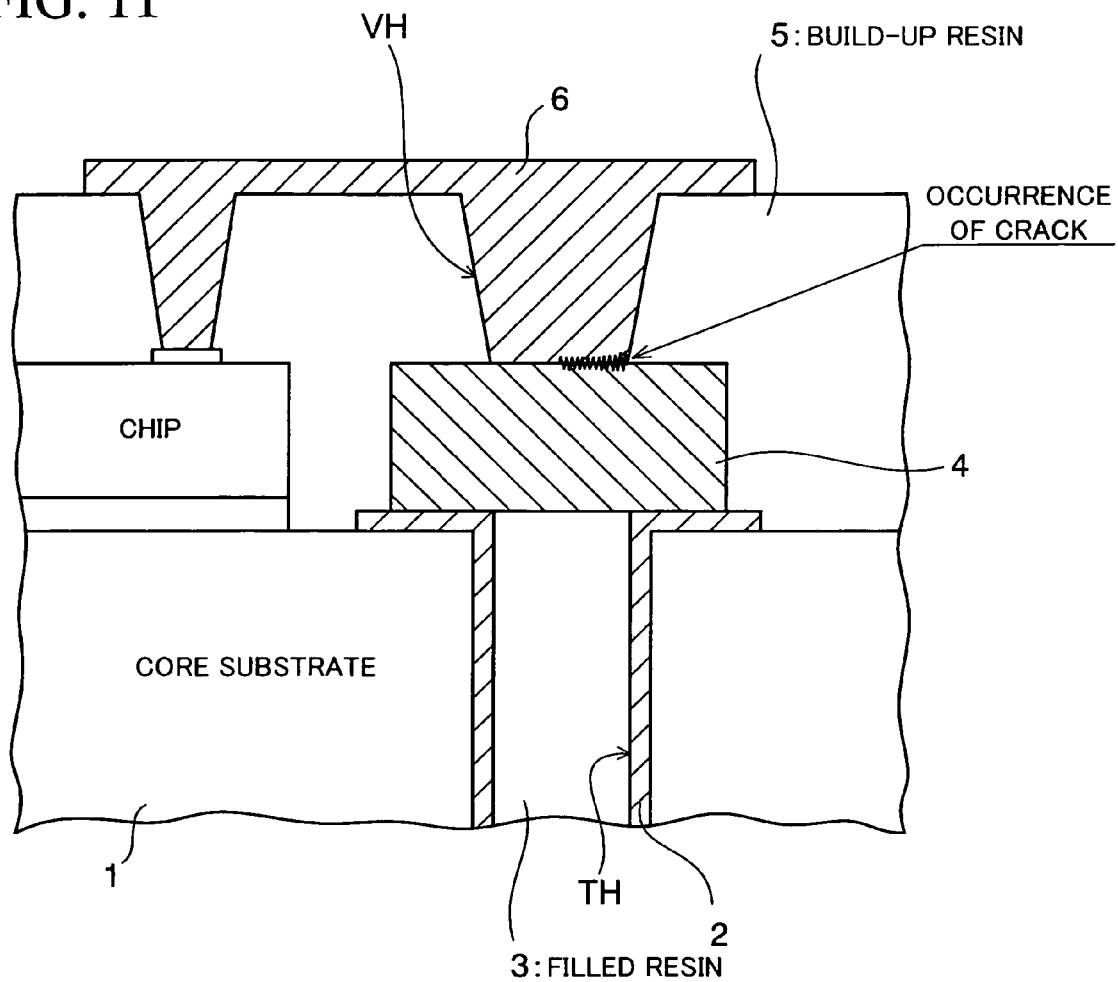
FIG. 11 is a view for explaining problems of a prior art semiconductor device (chip-embedded package).

Thus, the chip-embedded package 10 according to this embodiment has the feature in that the positions of the through holes TH to be formed in the core substrate 21 are arranged to be included in the chip mount area MR when viewed two-dimensionally. Further, because of this constitution, via holes for interlayer connection cannot be formed on the through holes (see the cross-sectional constitution of FIG. 1). Accordingly, as a countermeasure against this, the via holes VH1 for interlayer connection are formed on portions (pad portions 25P) of the wiring layers 25 electrically connected to the plated Cu layer 23 formed on the inner walls of the through holes, the portions extend in outward directions, i.e. extend toward the outside of the chip mount area MR. Namely, this is not a structure in which via holes VH are formed on the through holes TH with a thickly-formed conductor layer 4 interposed therebetween, such as encountered in the prior art (FIG. 11), but a structure in which the via holes VH1 are formed at positions deviated from the positions on the through holes TH outwardly.

Incidentally, where an external semiconductor element (chip) is mounted on the present device (chip-embedded package) 10, for example, a flip-chip bonding of the semiconductor chip to be mounted is performed so that electrodes, such as solder bumps, bonded to the tops of pads of the relevant chip are electrically connected to the pad portions 27P (plated Ni/Au layer 29) of the wiring layer 27 which are exposed from opening portions of the solder resist layer 28 on the upper side, and furthermore, underfill resin is filled in the space between the relevant chip and the solder resist layer 28 and cured, whereby the external semiconductor element is bonded to the device 10. Further, where the present device (chip-embedded package) 10 is mounted on a printed wiring board such as a mother board, as in the above-described case, solder balls to serve as external connection terminals (solder bumps) are bonded by reflow soldering to the pad portions 27P (plated Ni/Au layer 29) exposed from opening portions of the solder resist layer 28 on the lower side, and thus the device 10 is connected to corresponding pads or lands on the mother board through these solder bumps.

The semiconductor device (chip-embedded package) 10 according to this embodiment can be manufactured using the technology of a build-up process. One example of such a manufacturing method will be described below with reference to FIGS. 3A to 5B.

To begin with, in the first step (FIG. 3A), a copper-clad laminate (e.g. a plate obtained by laminating and bonding the copper foil 22 to both surfaces of a prepreg (insulating base material 21) which is obtained by immersing a glass cloth as a base material in epoxy resin, BT resin, polyimide resin, or the like) is prepared, and the through holes TH are formed at specific positions (required positions in the chip mount area MR shown in FIG. 2A) in the copper-clad laminate by a hole-making process using a mechanical drill.

In the next step (FIG. 3B), the plated layer 23 is deposited on the copper foil 22 including the inner walls of the through holes TH, for example, by electroless Cu plating.

In the next step (FIG. 3C), for example, by screen printing, epoxy resin (insulators 24) is filled within the through holes TH, inside which the plated Cu layer 23 is deposited. At this time, surfaces of the filled portions do not necessarily become planarized. Accordingly, both surfaces are planarized by grinding as needed.

In the next step (FIG. 3D), the wiring layers 25 having required patterns are formed on both planarized surfaces, respectively. Specifically, seed layers (not shown) are formed on the entire surfaces by electroless Cu plating; then, plating resist (e.g. photosensitive dry films) are laminated on the entire surfaces; exposure and development (patterning of the dry films) are performed in the state where specific portions (portions corresponding to the positions of the plated Cu layer 23 and the filled resin 24 in the through holes) of the seed layers are exposed; openings are formed in the relevant portions of the plating resist (dry films); and, then, the tops of the seed layers which are exposed from the opening portions are electrolytically plated with Cu using the seed layers as power-supplying layers to thereby form the wiring layers 25. Furthermore, the plating resist is stripped off, and exposed portions of the seed layers (Cu), the plated Cu layer 23, and the copper foil 22 are removed by wet etching. At this time, the exposed wiring layers 25 are also etched. However, since the film thickness of the wiring layers 25 is considerably larger than the thicknesses of other conductor layers (Cu) such as the seed layers, etched portions are merely surface portions of the wiring layers 25.

In the next step (FIG. 3E), the resin layers 26a as interlayer insulating layers are formed on the wiring layers 25 patterned on both sides and the core substrate 21, respectively. For example, thermosetting resin, such as epoxy resin or polyimide resin, is laminated thereon. Note, a cure (hardening) process, which is usually performed after the laminating of build-up resin, is not performed at this stage.

In the next step (FIG. 4A), the chip 30 is embedded in a specific portion (portion corresponding to the area of the core substrate 21 in which the through holes are formed) in the resin layer 26a on one side (upper side in the illustrated example). In doing so, the chip 30 is embedded in the resin layer 26a so that the electrodes 31 of the chip 30 protrude from the surface of the resin layer 26a as shown in the drawing. At this time, the surface of the resin layer 26a has irregularities because of the electrodes 31 of the chip 30.

Figure 3A:
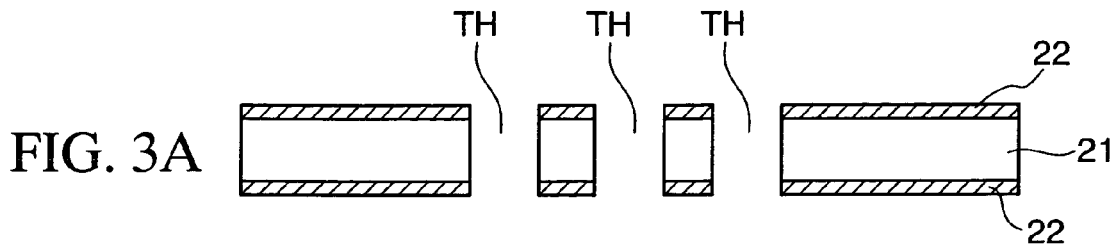
FIGS. 3A to 3E are cross-sectional views showing manufacturing steps for the semiconductor device of FIG. 1.
Figure 3B:
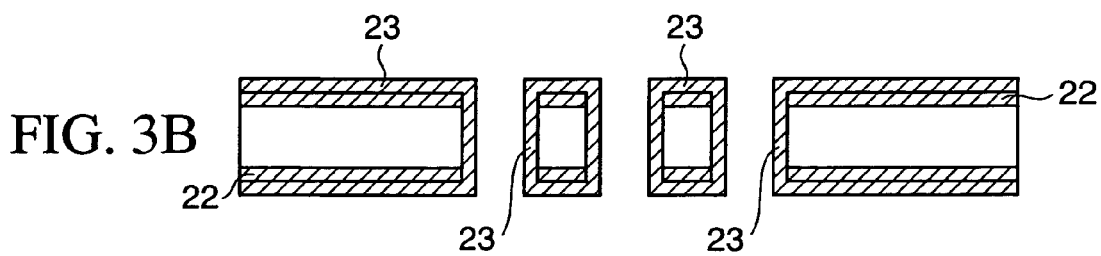
Figure 3C:
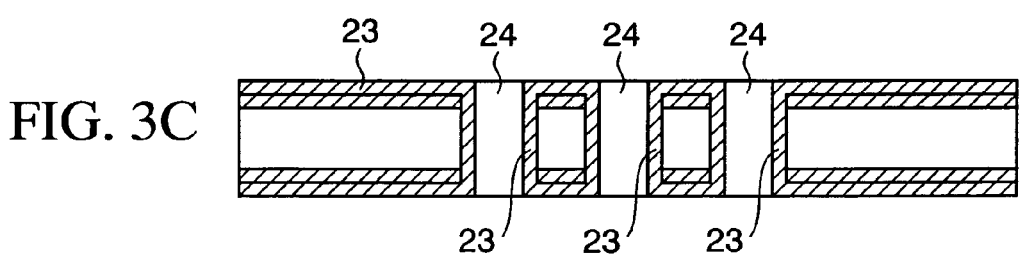
Figure 3D:
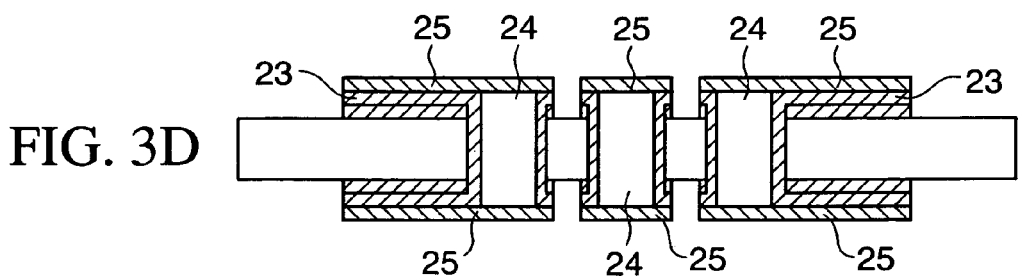
Figure 3E:
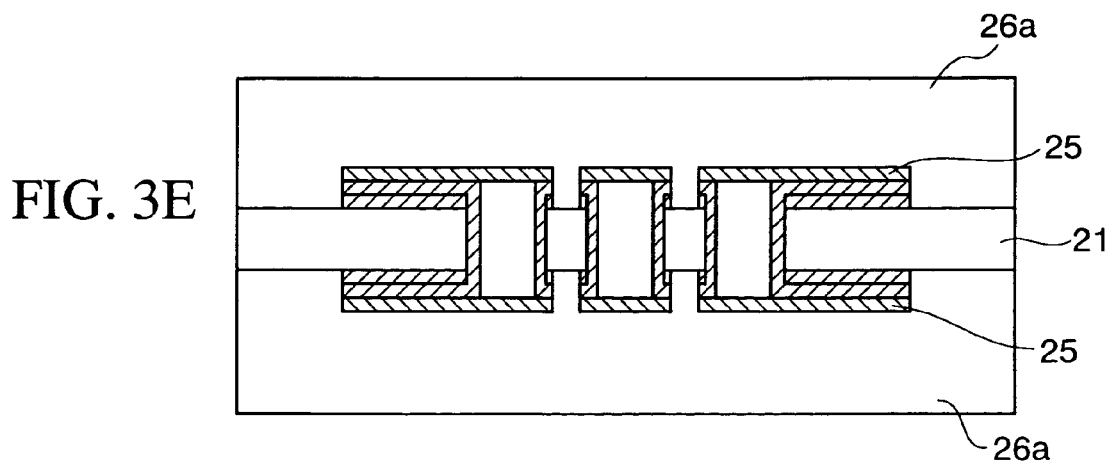
Figure 5A:
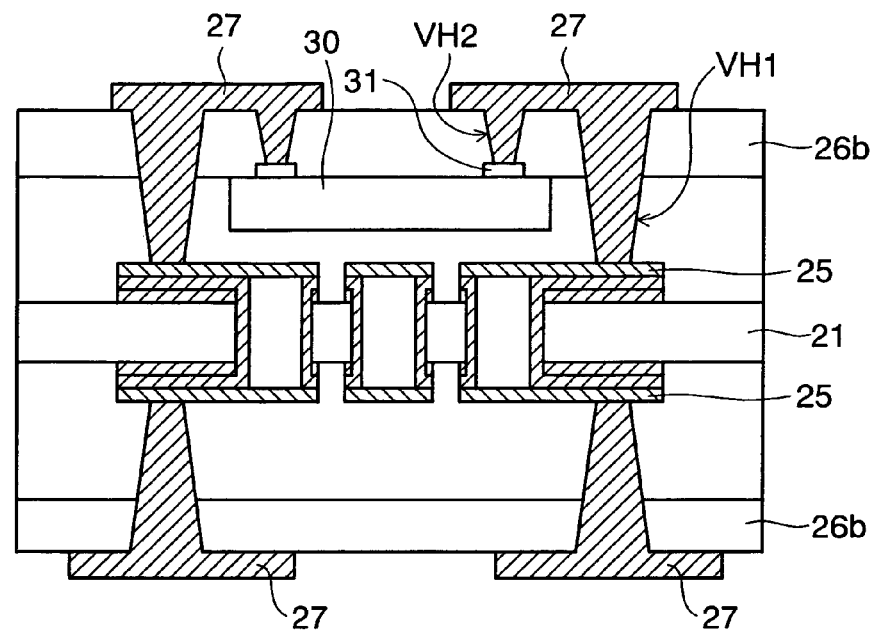
FIGS. 5A and 5B are cross-sectional views showing manufacturing steps subsequent to the steps of FIGS. 4A to 4C.
Figure 5B:
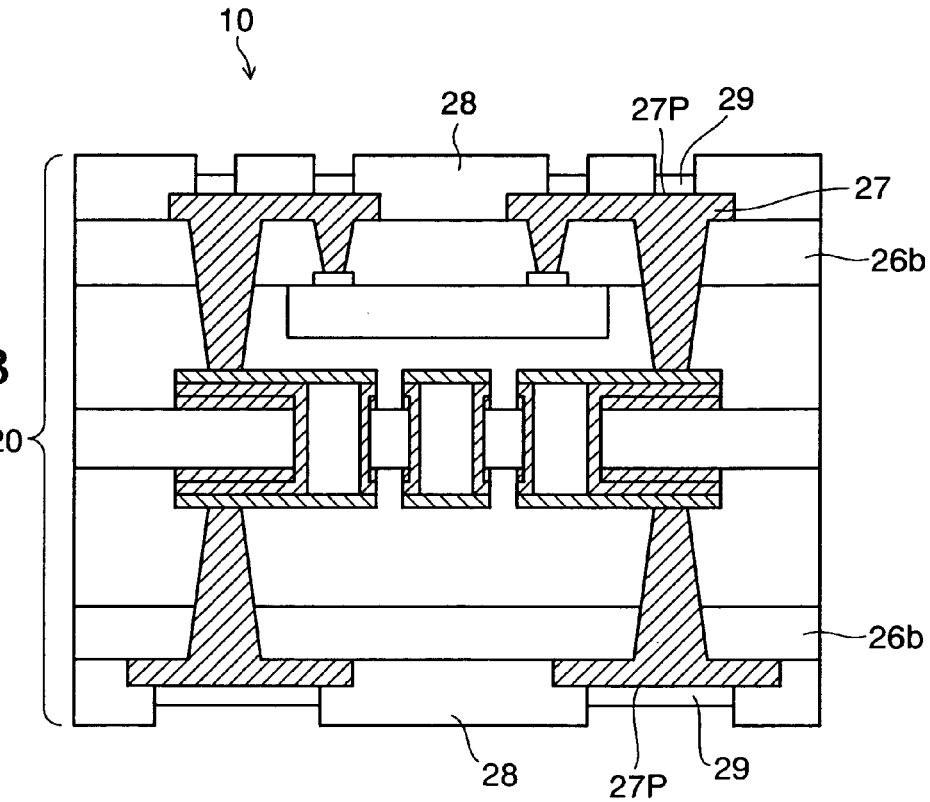

In the next step (FIG. 4B), as in the process performed in the step of FIG. 3E, thermosetting resin, such as epoxy resin or polyimide resin, is laminated on both surfaces (formation of the resin layers 26b). This lamination is performed in order to planarize the surface by eliminating the irregularities because of the electrodes 31 of the chip 30. The resin laminated in this step is the same material (e.g. epoxy resin) as the resin laminated in the step of FIG. 3E. At this stage, the resin layers 26a already laminated and the resin layers 26b newly laminated are simultaneously "cured."

In the next step (FIG. 4C), via holes VH1 and VH2 are formed at specific positions (in the case of the resin layer 26b on the upper side, positions corresponding to portions over the core substrate 21 in which the wiring layer 25 is formed and portions in which the electrodes 31 of the chip 30 are formed; in the case of the resin layer 26b on the lower side, positions corresponding to portions over the core substrate 21 in which the wiring layer 25 is formed) in the resin layers 26b formed on both sides so as to reach the wiring layers 25 and the electrodes 31 of the chip 30, respectively. For example, the via holes VH1 and VH2 are formed by removing the corresponding portions of the resin layers 26b using a $CO_2$ laser, a UV-YAG laser, or the like.

In the next step (FIG. 5A), the wiring layers 27 having required pattern shapes are formed on the resin layers 26b on both sides, including the insides of the via holes VH1 and VH2. As in the process performed in the step of FIG. 3D, the wiring layers 27 can be formed through a process including the formation of seed layers by electroless Cu plating, the patterning of plating resist, electrolytic Cu plating, the stripping-off of the plating resist, and the removal of other conductor layers (Cu) such as the seed layers by etching. Thus, the electrodes 31 of the chip 30 are connected via the conductors (part of the wiring layer 27) filled in the via holes VH2, the patterned wiring layer 27, and the conductors (part of the wiring layer 27) filled in the via holes VH1 to the wiring layer 25 which is a layer under the via holes VH1.

In the final step (FIG. 5B), the solder resist layers (protective films) 28 are formed to cover the wiring layers 27 and the resin layers 26b in such a manner that the respective pad portions 27P of the wiring layers 27 on both sides are exposed. For example, photosensitive solder resist is applied to the entire surface, exposure and development (patterning of the solder resist) are performed in accordance with the required shapes of the pad portions 27P, and openings are made in portions of the solder resist layers, the portions corresponding to the regions of the pad portions 27P. Thus, the pad portions 27P of the wiring layers 27 are exposed, and other portions of the wiring layers 27 are covered with the solder resist layers 28.

Furthermore, the tops of the pad portions 27P (Cu) exposed from the solder resist layers 28 are plated with nickel (Ni) and gold (Au), thus depositing the plated Ni/Au layers 29 thereon. This is intended for obtaining improved adhesiveness to the pad portions 27P when solder bonding is performed in a later stage. Thus, the semiconductor device 10 (wiring board 20) of this embodiment is fabricated.

As described above, according to the constitution (FIGS. 1 and 2A) of the semiconductor device (chip-embedded package) 10 of the first embodiment, the positions of the through holes TH to be formed in the core substrate 21 are arranged to be included in the chip mount area MR. Further, the via holes VH1 are formed on portions (pad portions 25P) of the wiring layers 25 electrically connected to the plated Cu layer 23 formed on the inner walls of the through holes, the portions extend in outward directions, i.e., extend toward the outside of the chip mount area MR. Namely, this is not a structure in which via holes are formed on through holes, such as encountered in the prior art (FIG. 11), but a structure in which the via holes VH1 for interlayer connection are formed at positions deviated from the positions on the through holes TH outwardly.

Accordingly, where a temperature cycling test is performed on this structure, even if pumping occurs due to the expansion and contraction of resin in through holes as heretofore, the influence thereof is not exerted directly on via holes (corresponding to the via holes VH1 of this embodiment). Consequently, cracks such as encountered in conventional technologies can be effectively prevented from occurring. This contributes to an improvement in the reliability of the semiconductor device (chip-embedded package) 10 as a final product. Further, since the influence of pumping is not exerted directly on the via holes, the influence thereof is not exerted directly on wiring layers (corresponding to the wiring layers 27 of this embodiment) electrically connected through the via holes. As a result, the relevant wiring layers do not undulate, and cracks in wiring do not occur.

Figure 6:
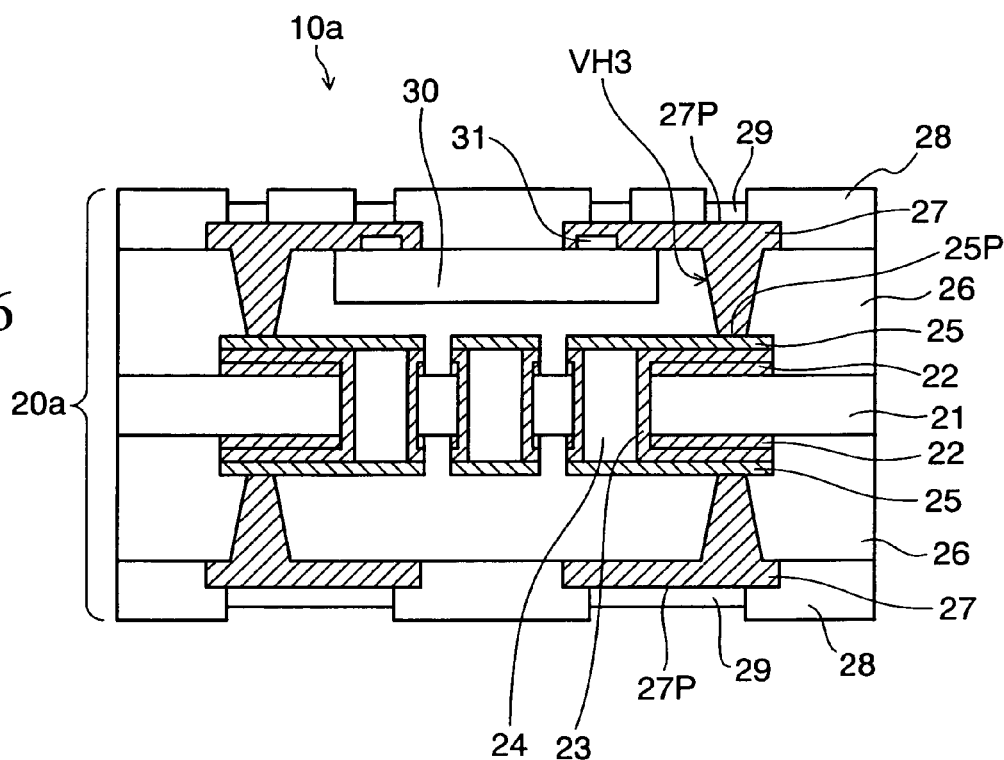
FIG. 6 is a cross-sectional view showing the constitution of a semiconductor device (chip-embedded package) according to a second embodiment of the present invention.

FIG. 6 schematically shows, in a cross-sectional view, the constitution of a semiconductor device according to a second embodiment of the present invention.

As in the case of the first embodiment (FIG. 1), the semiconductor device 10a according to this embodiment includes a wiring board 20a used as a package, and the semiconductor chip 30 mounted in this wiring board (package) 20a in an embedded manner. Note, the semiconductor device (chip-embedded package) 10a according to this embodiment differs from the semiconductor device (chip-embedded package) 10 according to the first embodiment in that the wiring layer 27 is formed directly on the surface of the embedded chip 30 on which the electrodes 31 are formed.

Namely, in the first embodiment (FIG. 1), the electrodes 31 of the embedded chip 30 are connected to the wiring layer 27 through the via holes VH2 formed in the resin layer 26b; while, in this second embodiment (FIG. 6), the electrodes 31 of the embedded chip 30 are connected directly to the wiring layer 27 formed on a resin layer 26 in which the chip 30 is embedded. Because of this difference in connection, the number of build-up layers (resin layers) deposited on each side of the core substrate 21 becomes one (resin layer 26) in this embodiment, although the number is two (resin layers 26a and 26b) in the case of the first embodiment. Other components and the functions thereof are basically the same as in the case of the first embodiment, and therefore will not be further described.

Figure 7A:
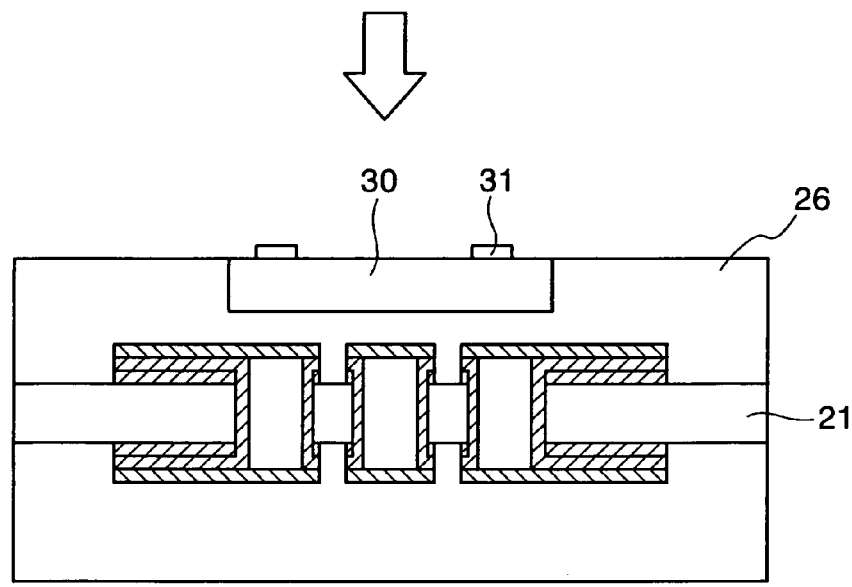
FIGS. 7A and 7B are cross-sectional views showing manufacturing steps for the semiconductor device of FIG. 6.
Figure 7B:
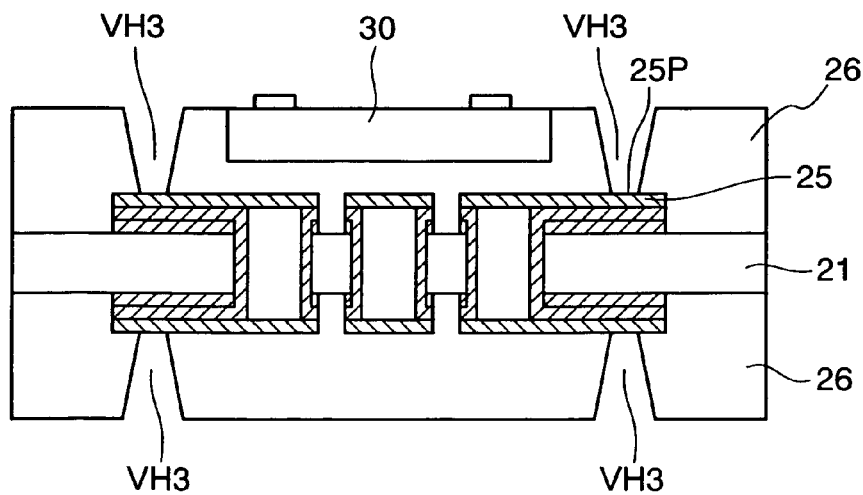
Figure 8A:
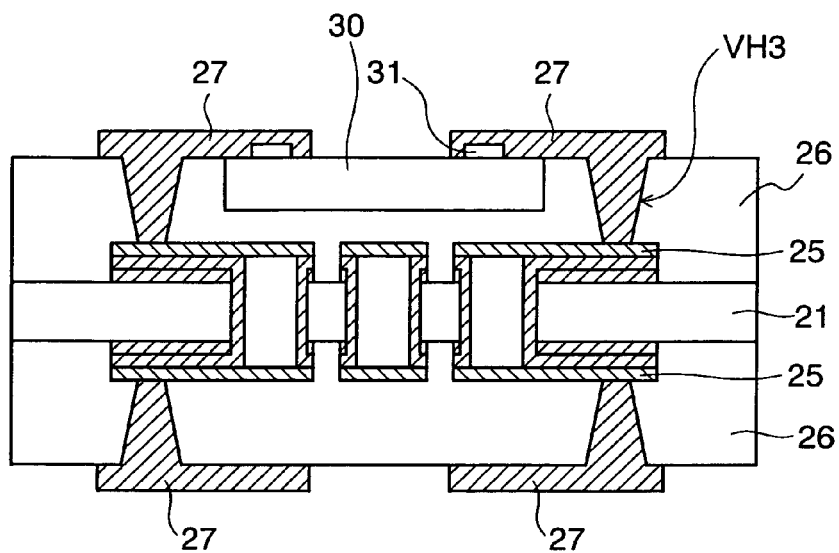
FIGS. 8A and 8B are cross-sectional views showing manufacturing steps subsequent to the steps of FIGS. 7A and 7B.
Figure 8B:
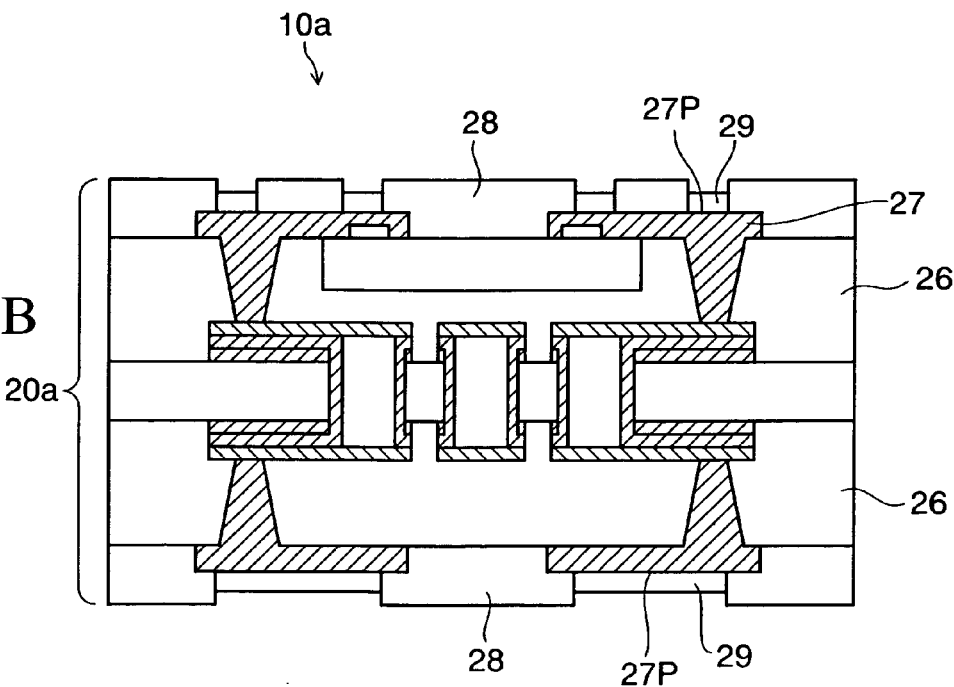

Further, as for a method of manufacturing the semiconductor device 10a of this embodiment, some of the manufacturing steps thereof are different because of this structural difference. Namely, the manufacturing method (FIGS. 7A to 8B) according to this embodiment basically differs from the manufacturing method (FIGS. 3A to 5B) according to the first embodiment in that cure (hardening) is performed at the time of embedding the chip 30 in the resin layer 26 in the step of FIG. 7A. The steps subsequent to the step of FIG. 7B are basically the same as the step of FIG. 4C according to the first embodiment and those subsequent thereto, and will not be further described. Note, in the step of FIG. 8A, first, zincate treatment is performed on the entire surface, and then, seed layers are formed by electroless Cu plating. Alternatively, seed layers are formed on the entire surface by sputtering chromium (Cr) and Cu. Thereafter, as in the process performed in the step of FIG. 5A, the wiring layers 27 are formed through a process including the patterning of plating resist, electrolytic Cu plating, the stripping-off of the plating resist, and the removal of other conductor layers (Cu) such as the seed layers by etching.

In addition to the advantages obtained by the first embodiment, the constitution of the semiconductor device (chip-embedded package) 10a according to the second embodiment also provides the advantage in that the total thickness of the package 10a can be relatively reduced, because the wiring layer 27 is formed directly on the embedded chip 30 (surface on which the electrodes 31 are formed) without involving via holes. Namely, the package can be thinned compared with the case of the first embodiment (FIG. 1).

Figure 9:
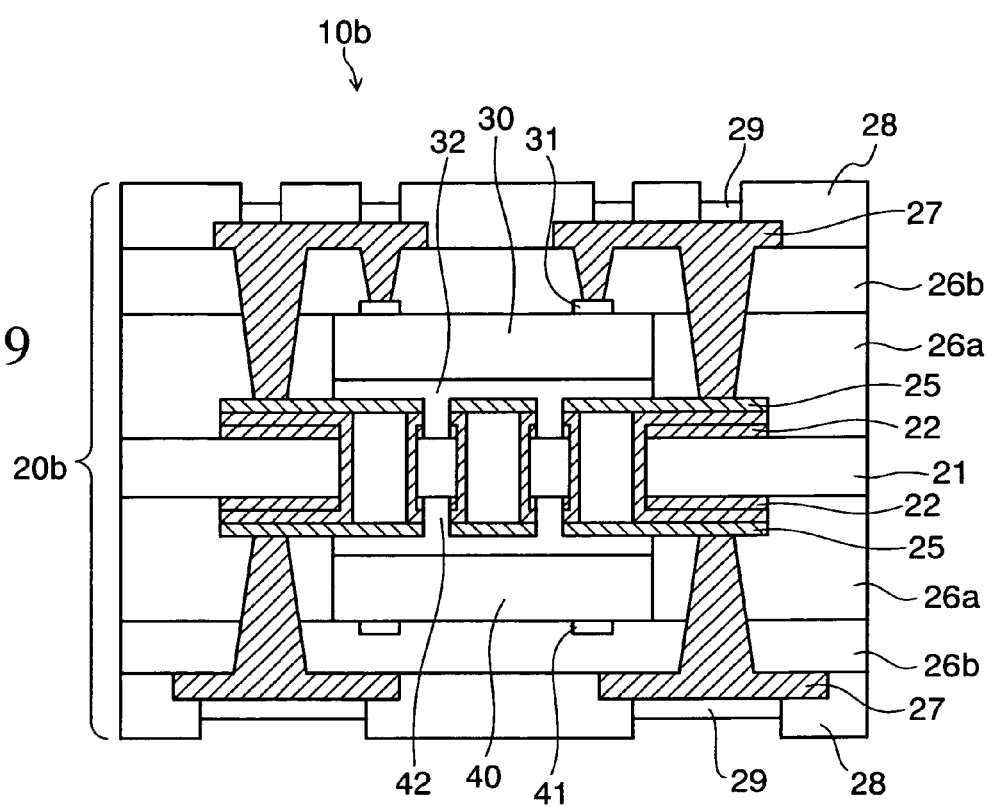
FIG. 9 is a cross-sectional view showing the constitution of a semiconductor device (chip-embedded package) according to a third embodiment of the present invention.

FIG. 9 schematically shows, in a cross-sectional view, the constitution of a semiconductor device according to a third embodiment of the present invention.

As in the case of the first embodiment (FIG. 1), the semiconductor device 10b according to this embodiment includes a wiring board 20b used as a package, and semiconductor chips 30 and 40 mounted in this wiring board (package) 20b in an embedded manner. Note, the semiconductor device (chip-embedded package) 10b according to this embodiment differs from the semiconductor device (chip-embedded package) 10 according to the first embodiment in that the embedded chips 30 and 40 are placed at vertically symmetrical positions with respect to the core substrate 21.

Namely, in the first embodiment (FIG. 1), the chip 30 is merely embedded in the resin layer 26a; while, in this third embodiment (FIG. 9), the chips 30 and 40 are mounted in the resin layers 26a respectively in an embedded manner in the state where the chips 30 and 40 are glued with adhesives 32 and 42, respectively, to symmetrical portions over the core substrate 21 and the respective wiring layers 25 formed over both surfaces of the core substrate 21. Other components and the functions thereof are basically the same as in the case of the first embodiment, and therefore will not be further described.

Further, a method of manufacturing the semiconductor device 10b of this embodiment is also basically the same as in the case (FIGS. 3A to 5B) of the first embodiment. Note, part of the manufacturing steps thereof are different because of the above-described difference in the mounting. Namely, in this embodiment, cure (hardening) is performed at the time of laminating the resin layers 26a in the step of FIG. 3E, and cavities which reach the wiring layers 25 are formed, for example, by routing at specific positions (positions corresponding to the area in the core substrate 21 in which the through holes are formed) in the hardened resin layers 26a. Further, the adhesives 32 and 42 are attached to the chips 30 and 40 respectively, and then, the chips 30 and 40 having the adhesives 32 and 42 attached thereto respectively are mounted on the wiring layers 25 in the corresponding cavities. Thereafter, the step of FIG. 4B and subsequent steps are performed.

In addition to the advantages obtained by the first embodiment, the constitution of the semiconductor device (chip-embedded package) 10b according to the third embodiment also provides the advantage in that a warpage of the entire package can be prevented, because the chips 30 and 40 are placed at vertically symmetrical positions with respect to the core substrate 21, respectively. Namely, where a chip is mounted on only one side of a core substrate with an adhesive in a mount mode such as shown in FIG. 9, a package may warp due to the difference in thermal expansion coefficients among the chip, the core substrate, and their surrounding build-up layers; however, warpage of the package can be effectively suppressed by mounting the chips 30 and 40 on both surfaces of the core substrate 21 as in this third embodiment.

Figure 10:
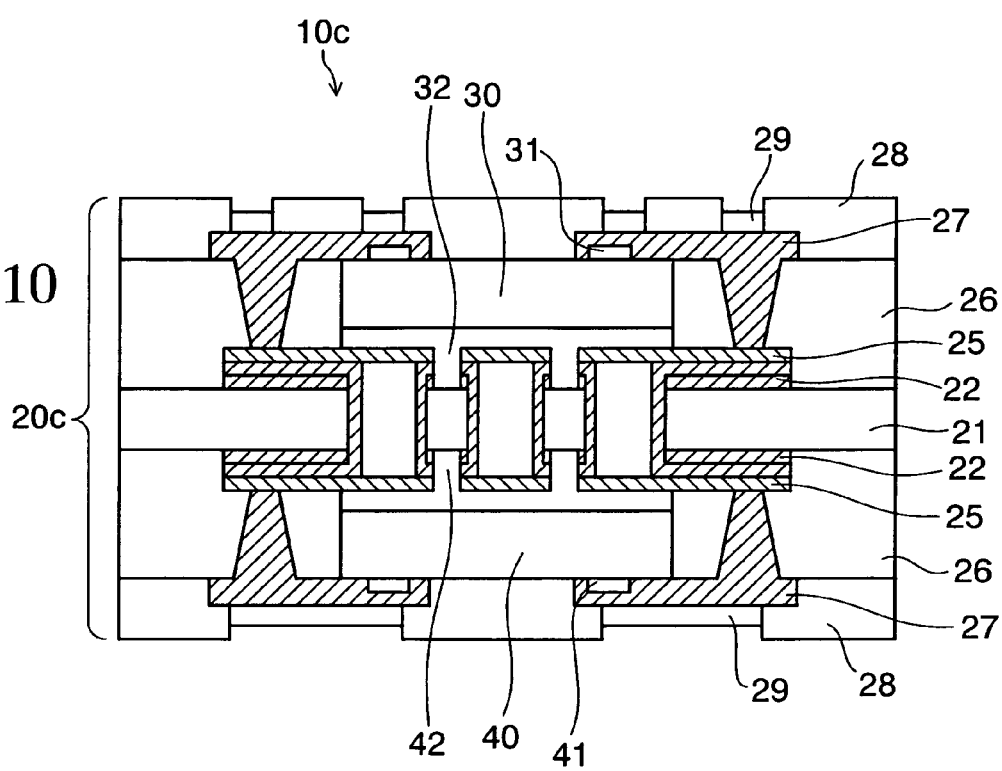
FIG. 10 is a cross-sectional view showing the constitution of a semiconductor device (chip-embedded package) according to a fourth embodiment of the present invention.

FIG. 10 schematically shows, in a cross-sectional view, the constitution of a semiconductor device according to a fourth embodiment of the present invention.

As in the case of the second embodiment (FIG. 6), the semiconductor device 10c according to this embodiment includes a wiring board 20c used as a package, and semiconductor chips 30 and 40 mounted in this wiring board (package) 20c in an embedded manner. Note, the semiconductor device (chip-embedded package) 10c according to this embodiment differs from the semiconductor device (chip-embedded package) 10a according to the second embodiment in that the embedded chips 30 and 40 are placed at vertically symmetrical positions with respect to the core substrate 21.

Namely, in the second embodiment (FIG. 6), the chip 30 is merely embedded in the resin layer 26; while, in this fourth embodiment (FIG. 10), as in the case of the third embodiment (FIG. 9), the chips 30 and 40 are mounted in resin layers 26 in an embedded manner in the state where the chips 30 and 40 are glued with adhesives 32 and 42, respectively, to symmetrical portions over the core substrate 21 and respective wiring layers 25 formed over both surfaces of the core substrate 21. Other components and the functions thereof are basically the same as in the case of the second embodiment, and therefore will not be further described.

Further, a method of manufacturing the semiconductor device 10c of this embodiment is also basically the same as in the case of the second embodiment (FIGS. 7A to 8B). Note, some of the manufacturing steps thereof are different because of the above-described difference in the mounting. The different steps are the same as those described in connection with the third embodiment (FIG. 9). Namely, cure (hardening) is performed at the time of laminating the resin layers 26, cavities which reach the wiring layers 25 are formed at specific positions in the hardened resin layers 26, and then, the chips 30 and 40 are mounted on the wiring layers 25 in the cavities with the adhesives 32 and 42 interposed therebetween, respectively. Thereafter, the step of FIG. 7B and the steps subsequent thereto are performed.

In addition to the advantages obtained by the second embodiment, the constitution of the semiconductor device (chip-embedded package) 10c according to the fourth embodiment also provides the advantage in that warpage of the package can be effectively suppressed, because the chips 30 and 40 are placed at vertically symmetrical positions with respect to the core substrate 21, respectively, as in the third embodiment (FIG. 9).

Incidentally, in the constitutions according to the aforementioned first and second embodiments (FIGS. 1 and 6), descriptions have been made by taking as an example the case where the chip 30 is embedded in a build-up layer (resin layer 26 or 26a) deposited on the upper side (the side where an external semiconductor chip is to be mounted) of the core substrate 21. However, it is a matter of course that a resin layer in which the chip 30 is embedded is not limited to this. For example, it is also possible to embed the chip 30 in a build-up layer on the lower side (the side where the relevant package 10 or 10a is mounted on a mother board or the like) of the core substrate 21.

As apparent from the spirit of the present invention, what is essential is a package structure in which, as schematically shown in FIG. 2A, the positions of the through holes TH to be formed in the core substrate 21 are included in the chip mount area MR when viewed two-dimensionally, and in which, as shown in the cross-sectional constitution of FIG. 1 (FIG. 6, 9 or 10), the via holes VH1 are formed on outwardly extending portions (pad portions 25P) of the wiring layers 25 electrically connected to the plated Cu layer 23 formed on the inner walls of the through holes.

Further, in the constitutions according to the aforementioned first and second embodiments (FIGS. 1 and 6), descriptions have been made by taking as an example the case where one chip 30 is embedded in one package. However, two or more chips 30 may be appropriately mounted therein in an embedded manner depending on functions required for the relevant package 10 or 10a or functions required for an external semiconductor chip to be mounted on the relevant package. Similarly, also in the constitutions according to the third and fourth embodiments (FIGS. 9 and 10), two or more pairs of chips 30 and 40 may be appropriately mounted therein in an embedded manner depending on functions and the like required for the relevant package 10b or 10c, although one pair of chips 30 and 40 are embedded on opposite sides of the core substrate 21, respectively, in the illustrated examples.

What is claimed is:

1. A semiconductor device comprising:
    an insulating base material;
    a plurality of wiring layers each patterned in a required shape and laminated over both surfaces of the insulating base material with at least one insulating layer interposed therebetween, the wiring layers being electrically connected to one another through at least one via hole, the via hole being formed to pierce the insulating layer in a direction of thickness; and
    a chip mounted in an embedded manner in the insulating layer over at least one surface of the insulating base material, the chip having at least one electrode electrically connected to one of the wiring layers,
    wherein at least one through hole is formed in a portion of the insulating base material, the portion corresponding to a mount area for the chip, and each via hole is formed on an outwardly extending portion of one of the wiring layers, the one wiring layer being electrically connected to a conductor layer formed at least on an inner wall of the through hole.

2. The semiconductor device according to claim 1, wherein in the respective insulating layers over both surfaces of the insulating base material, chips are mounted in an embedded manner in symmetrical portions with respect to the insulating base material, respectively, and each chip has at least one electrode electrically connected to a corresponding one of the wiring layers.

3. The semiconductor device according to claim 1, wherein the electrode of the chip is connected to one of the wiring layers through at least one via hole formed in the insulating layer laminated on the insulating layer in which the chip is mounted in an embedded manner.

4. The semiconductor device according to claim 1, wherein the electrode of the chip is directly connected to the wiring layer formed on the insulating layer in which the chip is mounted in an embedded manner.

5. The semiconductor device according to claim 1, further comprising a protective film formed on an outermost one of the wiring layers and the insulating layer with at least one pad portion of the outermost wiring layer exposed.

6. The semiconductor device according to claim 2, wherein the electrode of the chip is connected to one of the wiring layers through at least one via hole formed in the insulating layer laminated on the insulating layer in which the chip is mounted in an embedded manner.

7. The semiconductor device according to claim 2, wherein the electrode of the chip is directly connected to the wiring layer formed on the insulating layer in which the chip is mounted in an embedded manner.

* * * * *